US012598981B2

(12) United States Patent
Badaroglu et al.

(10) Patent No.: US 12,598,981 B2
(45) Date of Patent: Apr. 7, 2026

(54) PORT LANDING-FREE LOW-SKEW SIGNAL DISTRIBUTION WITH BACKSIDE METALLIZATION AND BURIED RAIL

(71) Applicant: QUALCOMM Incorporated, San Diego, CA (US)

(72) Inventors: Mustafa Badaroglu, Leuven (BE); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 663 days.

(21) Appl. No.: 17/932,500

(22) Filed: Sep. 15, 2022

(65) Prior Publication Data

US 2024/0096790 A1 Mar. 21, 2024

(51) Int. Cl.
*H01L 23/528* (2006.01)
*H01L 21/768* (2006.01)
*H01L 23/48* (2006.01)

(52) U.S. Cl.
CPC ...... *H01L 23/528* (2013.01); *H01L 21/76802* (2013.01); *H01L 21/76834* (2013.01); *H01L 21/76877* (2013.01); *H01L 21/76898* (2013.01); *H01L 23/481* (2013.01); *H01L 23/5286* (2013.01)

(58) Field of Classification Search
CPC ............. H01L 23/528; H01L 21/76802; H01L 21/76834; H01L 21/76877
See application file for complete search history.

(56) References Cited

U.S. PATENT DOCUMENTS

| | | | | |
|---|---|---|---|---|
| 6,037,822 A * | 3/2000 | Rao | ........................ | H01L 23/522 |
| | | | | 327/295 |
| 9,612,615 B2 * | 4/2017 | Lin | ......................... | H01L 24/06 |
| 11,121,086 B2 * | 9/2021 | Hiblot | ................ | H10D 30/0297 |
| 11,423,204 B1 * | 8/2022 | Chen | ...................... | G06F 30/394 |
| 11,658,119 B2 * | 5/2023 | Huang | ................... | H10D 84/83 |
| | | | | 257/368 |
| 11,748,546 B2 * | 9/2023 | Chen | ...................... | G06F 30/392 |
| | | | | 716/119 |
| 12,327,790 B2 * | 6/2025 | Lee | ......................... | H01L 23/528 |
| 2016/0131747 A1 * | 5/2016 | Tang | ..................... | G10K 11/346 |
| | | | | 367/140 |
| 2018/0061760 A1 * | 3/2018 | Lou | ....................... | H10D 84/038 |
| 2019/0051641 A1 * | 2/2019 | Lee | ......................... | H01L 23/528 |
| 2020/0203276 A1 * | 6/2020 | Hiblot | ................... | H01L 23/535 |

(Continued)

FOREIGN PATENT DOCUMENTS

| | | | | | |
|---|---|---|---|---|---|
| CN | 115810616 A | * | 3/2023 | ........... | H10D 64/254 |
| CN | 119451215 A | * | 2/2025 | ....... | H01L 21/76895 |

(Continued)

OTHER PUBLICATIONS

International Search Report and Written Opinion—PCT/US2023/073451—ISA/EPO—Dec. 12, 2023.

*Primary Examiner* — Laura M Menz
(74) *Attorney, Agent, or Firm* — Muncy, Geissler, Olds & Lowe, P.C./QUALCOMM

(57) ABSTRACT

Disclosed are integrated circuit structures with buried rails and backside metals for routing input signals to and/or output signals from one or more cells of the integrated circuit structures. Port landing-free connections to input ports and/or from output ports are enabled. As a result, signal routing flexibility is enhanced.

21 Claims, 17 Drawing Sheets

(56) References Cited

U.S. PATENT DOCUMENTS

| | | | | |
|---|---|---|---|---|
| 2021/0005230 A1 * | 1/2021 | Wang | ................... | G11C 7/1006 |
| 2021/0043557 A1 * | 2/2021 | Lee | ................... | H01L 21/76898 |
| 2022/0130759 A1 * | 4/2022 | Huang | ............. | H01L 21/76897 |
| 2022/0262791 A1 * | 8/2022 | Shi | ....................... | H10D 62/119 |
| 2022/0328399 A1 * | 10/2022 | Preston | ................ | H01L 23/481 |
| 2022/0335194 A1 * | 10/2022 | Chen | .................... | G06F 30/396 |
| 2023/0359799 A1 * | 11/2023 | Chen | .................... | G06F 30/392 |
| 2023/0378157 A1 * | 11/2023 | Liu | ....................... | G06F 30/392 |
| 2023/0420512 A1 * | 12/2023 | Yemenicioglu | .... | H10D 30/6735 |
| 2024/0079326 A1 * | 3/2024 | Senapati | ............. | H10N 70/011 |
| 2024/0096750 A1 * | 3/2024 | Liang | ............... | H01L 21/76802 |
| 2024/0096790 A1 * | 3/2024 | Badaroglu | .......... | H10D 84/038 |
| 2024/0313000 A1 * | 9/2024 | Kim | ..................... | H10D 86/441 |
| 2024/0355819 A1 * | 10/2024 | Shi | ....................... | H10D 62/119 |
| 2025/0070019 A1 * | 2/2025 | Kang | ................. | H01L 23/5256 |
| 2025/0095735 A1 * | 3/2025 | Hong | ................... | G11C 15/04 |

FOREIGN PATENT DOCUMENTS

| | | | | | | |
|---|---|---|---|---|---|---|
| CN | 120019729 A | * | 5/2025 | ....... | H01L 21/76895 |
| CN | 120051863 A | * | 5/2025 | ........ | H01L 23/5283 |
| DE | 102008047591 B4 | * | 8/2019 | ........ | H10D 84/0144 |
| EP | 3671859 A1 | * | 6/2020 | .......... | H10D 64/518 |
| EP | 4044231 A1 | * | 8/2022 | ........ | H01L 23/5286 |
| JP | 2015523594 A | * | 8/2015 | ............ | G10L 19/00 |
| KR | 20120035545 A | * | 4/2012 | .......... | H10D 64/017 |
| KR | 20250071236 A | * | 5/2025 | ....... | H01L 21/76895 |
| TW | 202431582 A | * | 8/2024 | ....... | H01L 21/76895 |
| WO | WO-2024051689 A1 | * | 3/2024 | ............ | H10B 63/80 |
| WO | WO-2024059450 A1 | * | 3/2024 | ....... | H01L 21/76895 |
| WO | WO-2024064520 A1 | * | 3/2024 | .......... | H10D 86/201 |

* cited by examiner

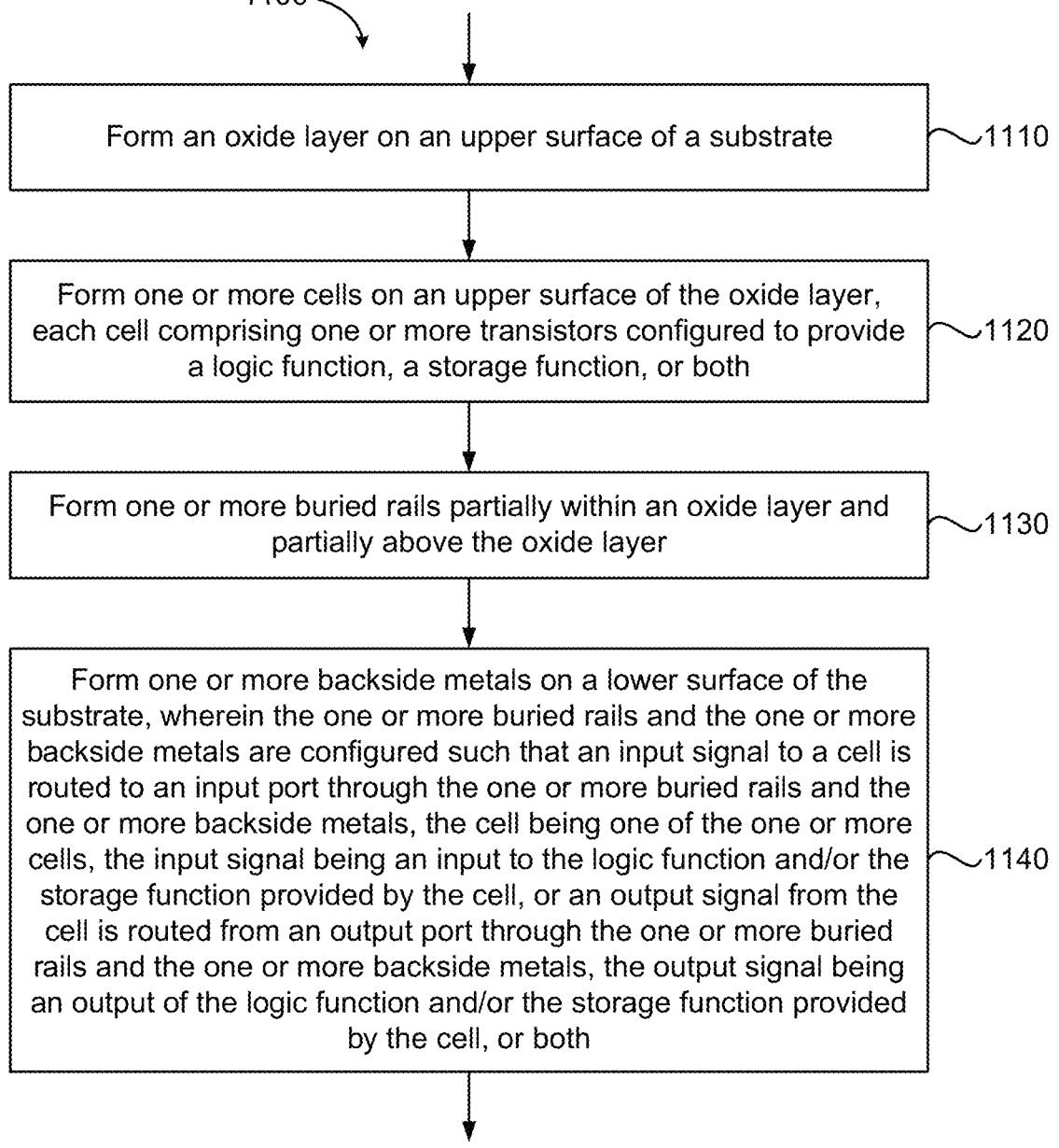

1100

Form an oxide layer on an upper surface of a substrate — 1110

Form one or more cells on an upper surface of the oxide layer, each cell comprising one or more transistors configured to provide a logic function, a storage function, or both — 1120

Form one or more buried rails partially within an oxide layer and partially above the oxide layer — 1130

Form one or more backside metals on a lower surface of the substrate, wherein the one or more buried rails and the one or more backside metals are configured such that an input signal to a cell is routed to an input port through the one or more buried rails and the one or more backside metals, the cell being one of the one or more cells, the input signal being an input to the logic function and/or the storage function provided by the cell, or an output signal from the cell is routed from an output port through the one or more buried rails and the one or more backside metals, the output signal being an output of the logic function and/or the storage function provided by the cell, or both — 1140

*FIG. 11*

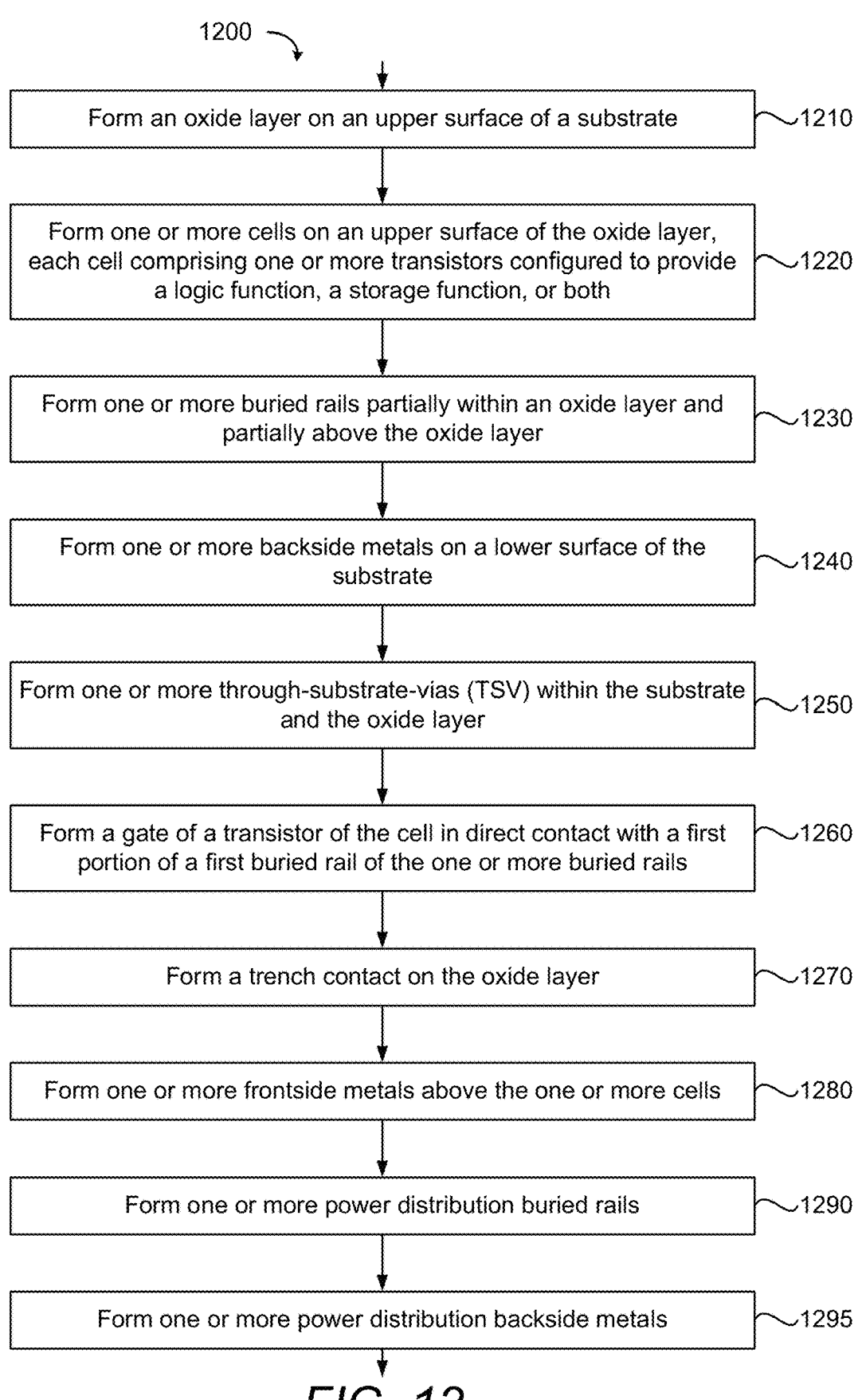

1200

| Form an oxide layer on an upper surface of a substrate | 1210 |

| Form one or more cells on an upper surface of the oxide layer, each cell comprising one or more transistors configured to provide a logic function, a storage function, or both | 1220 |

| Form one or more buried rails partially within an oxide layer and partially above the oxide layer | 1230 |

| Form one or more backside metals on a lower surface of the substrate | 1240 |

| Form one or more through-substrate-vias (TSV) within the substrate and the oxide layer | 1250 |

| Form a gate of a transistor of the cell in direct contact with a first portion of a first buried rail of the one or more buried rails | 1260 |

| Form a trench contact on the oxide layer | 1270 |

| Form one or more frontside metals above the one or more cells | 1280 |

| Form one or more power distribution buried rails | 1290 |

| Form one or more power distribution backside metals | 1295 |

FIG. 12

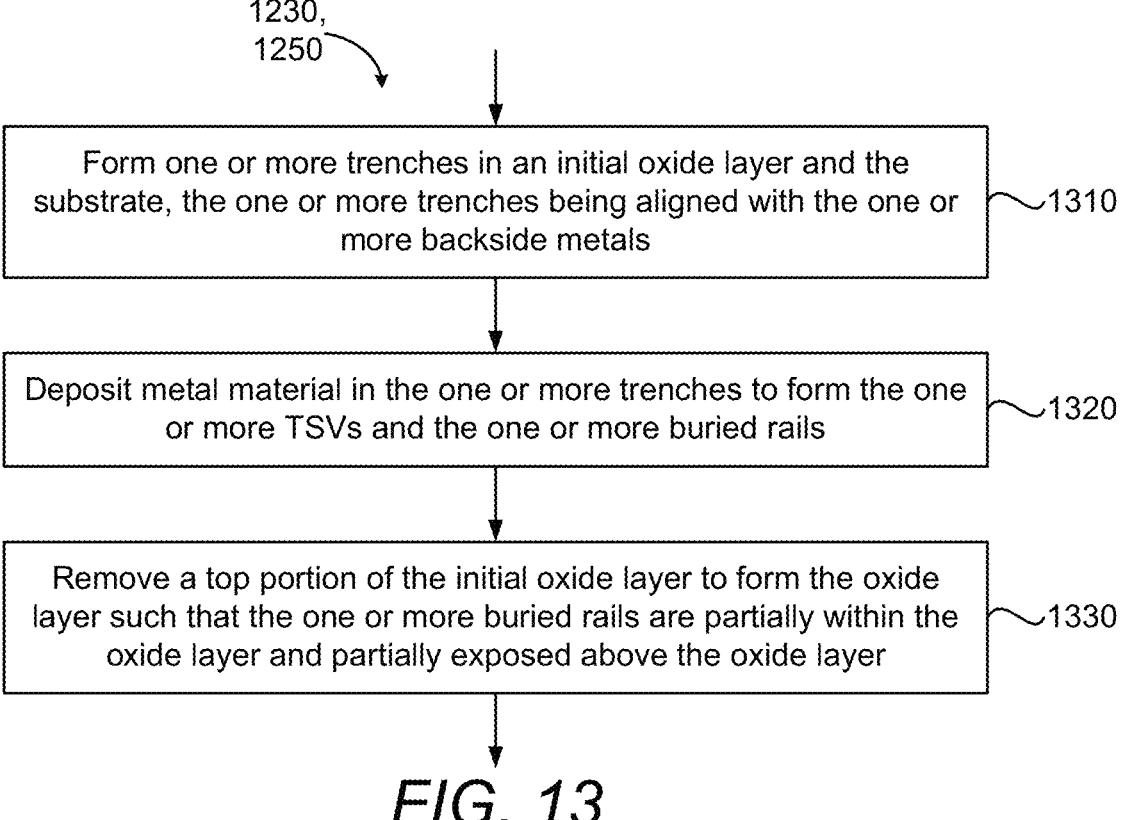

1230,
1250

| Form one or more trenches in an initial oxide layer and the substrate, the one or more trenches being aligned with the one or more backside metals | 1310 |

| Deposit metal material in the one or more trenches to form the one or more TSVs and the one or more buried rails | 1320 |

| Remove a top portion of the initial oxide layer to form the oxide layer such that the one or more buried rails are partially within the oxide layer and partially exposed above the oxide layer | 1330 |

*FIG. 13*

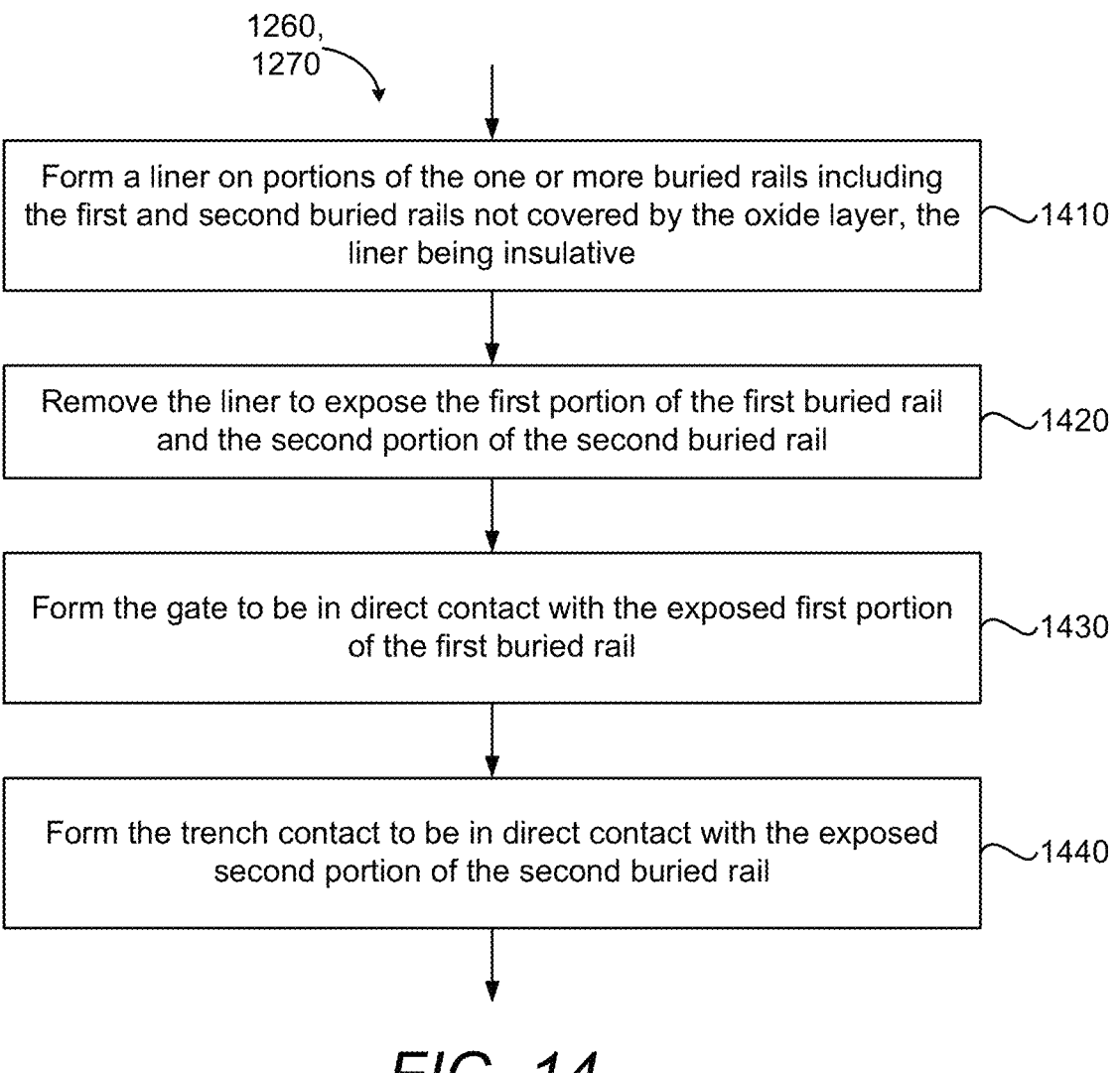

1260,
1270

Form a liner on portions of the one or more buried rails including
the first and second buried rails not covered by the oxide layer, the
liner being insulative ⟶1410

Remove the liner to expose the first portion of the first buried rail
and the second portion of the second buried rail ⟶1420

Form the gate to be in direct contact with the exposed first portion
of the first buried rail ⟶1430

Form the trench contact to be in direct contact with the exposed
second portion of the second buried rail ⟶1440

PORT LANDING-FREE LOW-SKEW SIGNAL DISTRIBUTION WITH BACKSIDE METALLIZATION AND BURIED RAIL

FIELD OF DISCLOSURE

This disclosure relates generally to high performance devices, and more specifically, but not exclusively, to devices with port landing-free low-skew signal distribution (e.g., clock signals) with backside metallization and buried rail.

BACKGROUND

Integrated circuit technology has achieved great strides in advancing computing power through miniaturization of components. Unfortunately, with miniaturization, resistance of interconnects and vias has increased. Clock distribution is becoming a challenge with the increases in resistances of interconnects and vias. Increased resistance can cause much more variation in timing, and therefore, can result in significant clock skew variation.

Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary integrated circuit structure is disclosed. The integrated circuit structure may comprise an oxide layer on an upper surface of a substrate. The integrated circuit structure may also comprise one or more cells on an upper surface of the oxide layer. Each cell may comprise one or more transistors configured to provide a logic function, a storage function, or both. The integrated circuit structure may further comprise one or more buried rails formed partially within the oxide layer and partially above the oxide layer. The integrated circuit structure may yet comprise one or more backside metals on a lower surface of the substrate. The one or more buried rails and the one or more backside metals may be configured such that an input signal to a cell is routed to an input port of the cell through the one or more buried rails and the one or more backside metals. The cell may be one of the one or more cells. The input signal may be an input to the logic function and/or the storage function provided by the cell. Alternatively or in addition thereto, the one or more buried rails and the one or more backside metals may be configured such that a signal from the cell is routed from an output port of the cell through the one or more buried rails and the one or more backside metals. The output signal may be an output of the logic function and/or the storage function provided by the cell.

A method of fabricating an integrated circuit structure is disclosed. The method may comprise forming an oxide layer on an upper surface of a substrate. The method may also comprise forming one or more cells on an upper surface of the oxide layer. Each cell may comprise one or more transistors configured to provide a logic function, a storage function, or both. The method may further comprise forming one or more buried rails partially within the oxide layer and partially above the oxide layer. The method may yet comprise forming one or more backside metals on a lower surface of the substrate. The one or more buried rails and the one or more backside metals may be configured such that an input signal to a cell is routed to an input port of the cell through the one or more buried rails and the one or more backside metals. The cell may be one of the one or more cells. The input signal may be an input to the logic function and/or the storage function provided by the cell. Alternatively or in addition thereto, the one or more buried rails and the one or more backside metals may be configured such that a signal from the cell is routed from an output port of the cell through the one or more buried rails and the one or more backside metals. The output signal may be an output of the logic function and/or the storage function provided by the cell.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 11-14 illustrate flow charts of an example method of manufacturing an integrated circuit structure in accordance with at one or more aspects of the disclosure.

Figure 1:
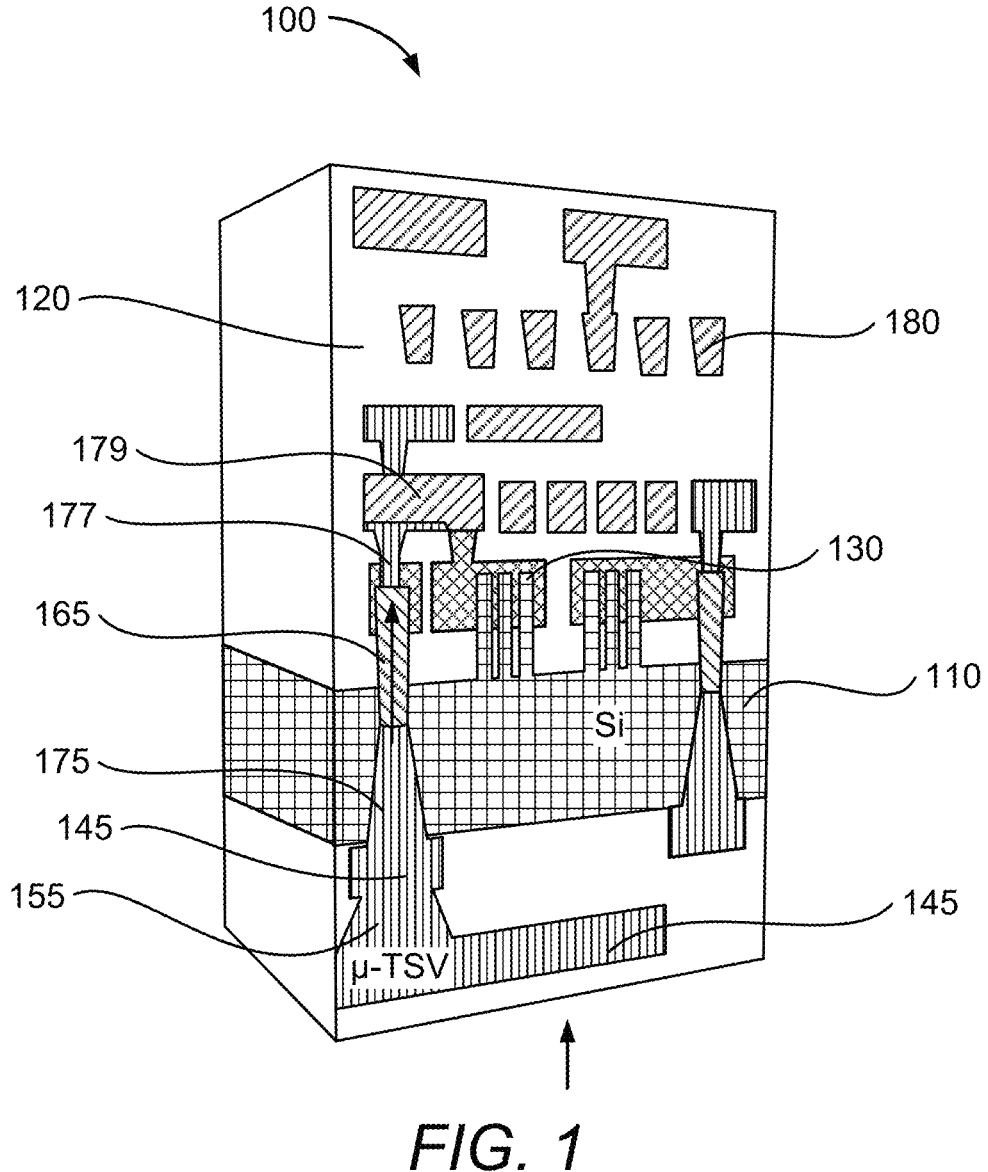
FIG. 1 illustrates an example of a conventional integrated circuit structure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, clock distribution is becoming a challenge with increases in resistances of interconnects and vias. As the critical dimensions (CD) of fabrication technologies decrease such as to 12 nm and below, interconnect resistances exponentially increase with dimensional scaling. This means that a small variation in interconnect widths can lead to dramatic changes in the resistance due to being in the exponential regime, that is caused by fixed barrier and liner surrounding the metal and surface and grain scattering effects. Vias also have similar issues. This means that there can be much more variation in timing, which in turn can lead to significant clock skew variations.

It is known that buried rail provides a low resistance solution for power delivery in standard cells. Buried rail with backside connection from the backside metals allow freeing up of routing resources on the frontside by having the power and ground connections from the backside. Buried rails is expected to become a baseline technology for integrated circuit structures or devices beyond 2025.

In integrated circuit structures, there can be many cells, in which each cell may be viewed as comprising one or more circuits such as transistors configured or otherwise arranged to provide a logic function or a storage function or both. Examples of logic functions may be as simple as ANDs, NANDs, NOTs (e.g., inverters), ORs, NORs, XORs, and so on. Cells providing logic functions may also include adders (integer and floating point), multipliers (integer and floating point), shifters, multiplexors, demultiplexors, and so on. Cells providing storage functions may include cells that provide data storage and/or data forward capabilities such as flip flops, memory cells, latches, buffers, and so on.

Typically, for power pin allocation for a standard cell, metal plate (e.g., landing pad) is introduced to be able to land on a critical structure. Unfortunately, such landing pads consume significant area. In other words, there is a significant area penalty. This limits the use of buried rail and backside metals for clock distribution networks.

To address one or more issues related with conventional technologies, it is proposed to use buried rail (BR) and backside metal (BM) for signal distribution networks in integrated circuit structures. An example of a signal distribution network is a clock distribution network.

Here, signal distribution is differentiated from power distribution. For each logic function or a storage function, there can be one or more inputs and one or more outputs of the function. Thus, in an aspect, an input signal for a cell may be viewed as an input to the logic function and/or the storage function provided by the cell. Conversely, an output signal for a cell may be viewed as an output of the logic function and/or the storage function provided by the cell.

FIG. 1 illustrates an example of a conventional integrated circuit (IC) structure 100. In FIG. 1, a perspective view is shown in which a cross section of the IC structure 100 is prominent. As seen, the IC structure 100 includes a substrate 110 and an oxide layer 120 above a silicon (Si) substrate 110. On the backside (e.g., lower surface) of the substrate 110, backside metals (BM) 145 and backside vias 155 are configured to deliver power to one or more cells 130. As seen, there can be multiple levels of backside metals 145. For example, the backside metals 145 above and below the backside via 155 may respectively BM0 and BM1. A through-substrate-via (TSV) 175 within the substrate 110 couples the backside metal 145 with a buried rail 165, which is a power rail. Power is delivered to the cell through a power via 177 and a landing pad 179. In the conventional IC structure 100, the buried rail 165 and the backside metals 145 only deliver power to the cell 130. All signals—input and/or output—are routed through the frontside metals 180.

Figure 2A:
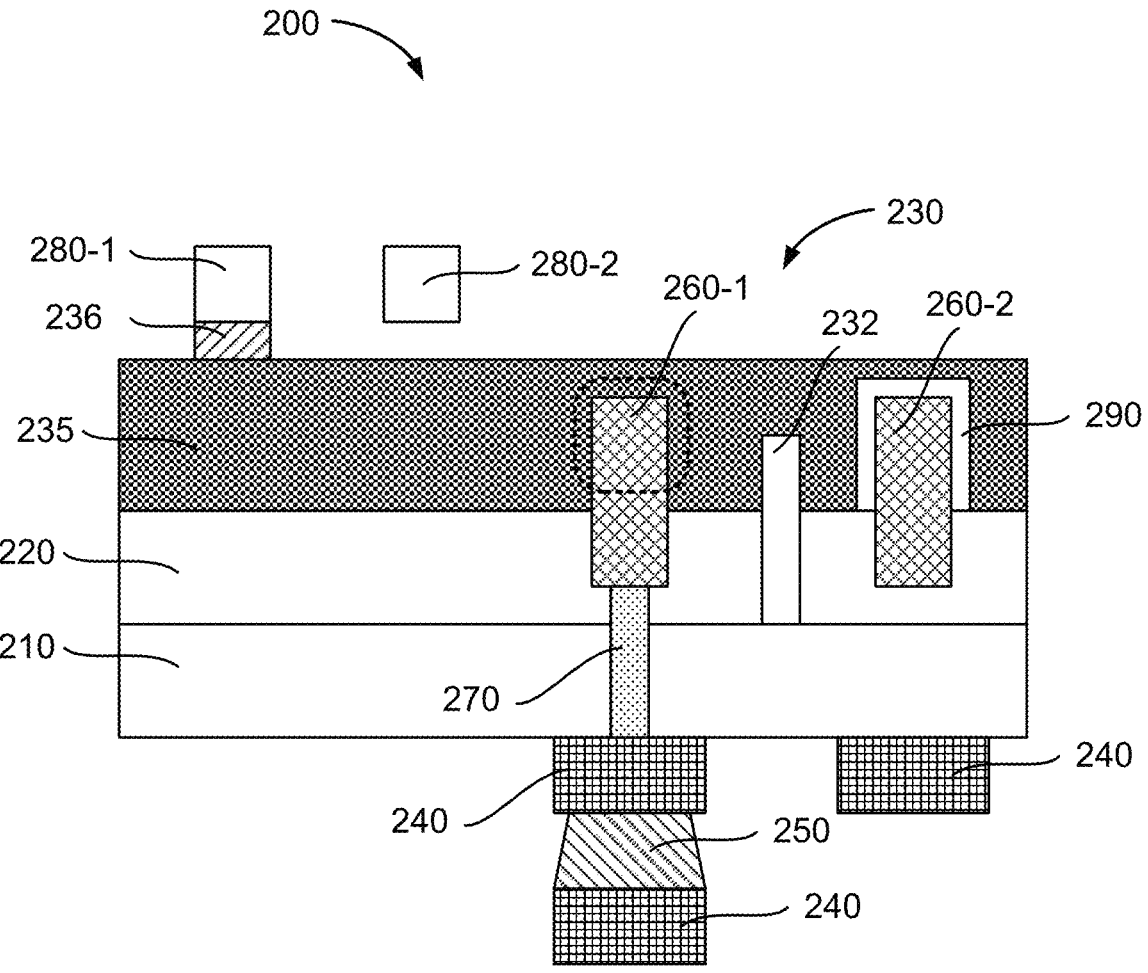
FIGS. 2A, 2B and 2C illustrate an example of an integrated circuit structure in accordance with one or more aspects of the disclosure.
Figure 2B:
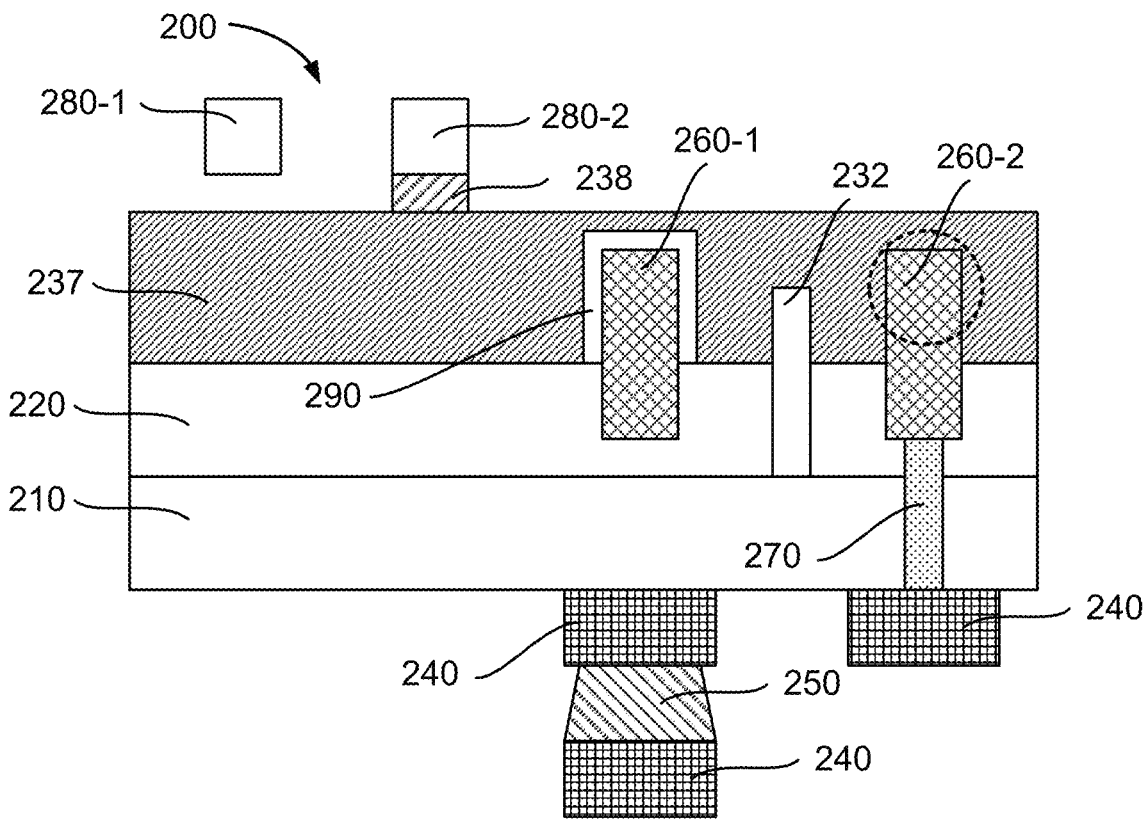
Figure 2C:
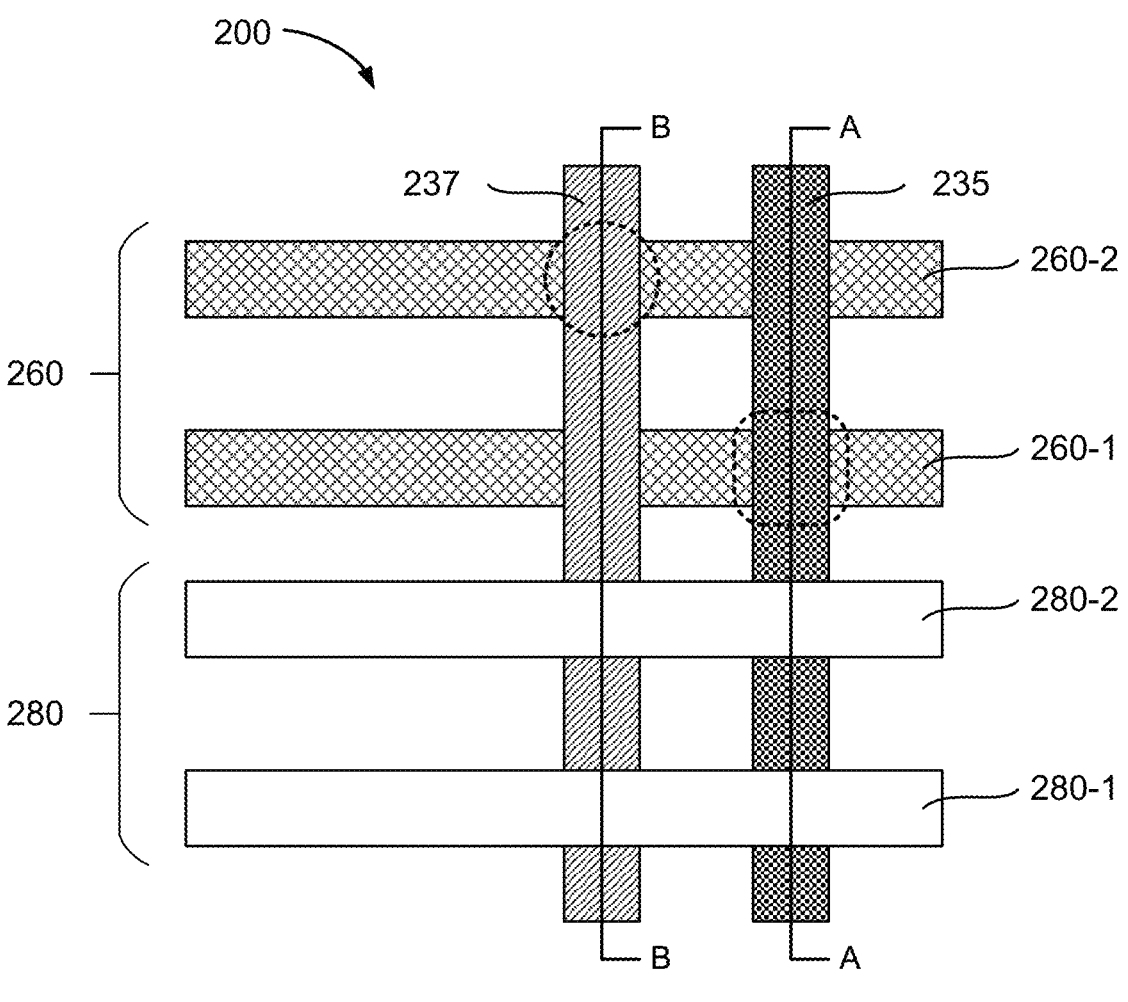

However, in an aspect, it is proposed to utilize the backside metals and buried rails for signal distribution. In FIGS. 2A, 2B and 2C, an integrated circuit structure 200 is shown according to one or more aspects are shown. FIG. 2A illustrates a cross section along the line A-A of FIG. 2C, FIG. 2B illustrates a cross section along the line B-B of FIG. 2C, and FIG. 2C shows a top view.

The integrated circuit structure 200 may comprise a substrate 210 and an oxide layer 220 on an upper surface of the substrate 210. One or more cells 230 may be formed within the oxide layer 220 and/or on an upper surface of the oxide layer 220. In an aspect, each cell 230 may be viewed as comprising one or more circuits such as transistors that are configured or otherwise arranged to provide a logic function or a storage function or both. Examples of logic functions may be as simple as ANDs, NANDs, NOTs, ORs, NORs, XORs, and so on. Cells providing logic functions may also include adders (integer and floating point), multipliers (integer and floating point), shifters, multiplexors, demultiplexors, and so on. Cells providing storage functions may include cells that provide data storage and/or data forward capabilities such as flip flops, memory cells, latches, buffers, and so on.

The integrated circuit structure 200 may also comprise one or more buried rails 260 and one or more backside metals 240. As seen, the buried rails 260 may be formed partially within the oxide layer 220 and partially above the oxide layer 220. In general, it may be said that the one or more buried rails 260 and the one or more backside metals 240 are configured or otherwise arranged to route signals to and/or from the cells 230 of the integrated circuit structure 200. For example, an input signal to a cell 230 may be routed to an input port of the cell 230 through the one or more buried rails 260 and the one or more backside metals 240. The input signal may be one of the one or more inputs to the logic function and/or the storage function provided by the cell 230. Alternatively or in addition thereto, an output signal from the cell 230 may be routed from an output port of the cell 230 through the one or more buried rails 260 and the one or more backside metals 240. The output signal may be one of one or more outputs of the logic function and/or the storage function provided by the cell 230.

FIG. 2A illustrates a cross sectional view of the integrated circuit structure 300 along the line A-A of FIG. 2C. In an aspect, the gate 235 of a transistor (not shown) of the cell 230 may be viewed as the input port of the cell 230. In an aspect, the transistor may be a finFET transistor, and hence may include one or more fins 232, or a nanosheet transistor that includes one or more vertically stacked sheets. In an aspect, the gate 235 may be in direct contact with a first portion of the first buried rail 260-1 (portion indicated by the dashed rounded square). More generally, the input port of the cell 230 may be in direct contact with the first portion of the first buried rail 260-1. With the direct connection between the input port and the first buried rail 260-1, other interconnection means such as vias and landing pads are NOT necessary. This means that area penalty associated with vias and landing pads is not incurred.

Note that the gate 235 is NOT electrically coupled to the second buried rail 260-2. As seen, an insulative liner 290 may be in between the gate 235 and the second buried rail 260-2.

The shape of the gate 235 can be conformal to the shape of the first buried rail 260-1 at the first portion. That is, the gate 235 may be in direct contact with the upper and side surfaces of the first buried rail 260-1 at the first portion. In an aspect, the gate 235 may comprise a doped semiconductor. For example, the gate 235 may be formed from poly-Si materials.

FIG. 2B is a cross sectional view of the integrated circuit structure 300 along the line B-B of FIG. 2C. Here, the trench contact 237 may be electrically coupled with a second portion of the second buried rail 260-2 (portion indicated by the dashed circle). In particular, the output port of the cell 230 may be direct contact with the second portion of the second buried rail 260-2. With the direct connection between the output port and the second buried rail 260-2, other interconnection means such as vias and landing pads are NOT necessary, i.e., area penalty associated with vias and landing pads need not be incurred.

Note that the trench contact 237 is NOT electrically coupled to the first buried rail 260-1. As seen, the insulative liner 290 may be in between the trench contact 237 and the first buried rail 260-1.

The shape of the trench contact 237 can be conformal to the shape of the second buried rail 260-2 at the second portion. That is, the trench contact 237 may be in direct contact with the upper and side surfaces of the second buried rail 260-2 at the second portion. In an aspect, the trench contact 37 may comprise a metal. For example, the trench contact 37 may be formed from any one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), ruthenium (Ru), etc.

FIG. 2C is a view from the top of the integrated circuit structure 300. In FIG. 2C, first and second frontside metals 280-1, 280-2, first and second buried rails 260-1, 260-2, a gate 235 (e.g., of a transistor of a cell 230), and a trench contact 237 are shown. It should be noted that there can be one or more frontside metals 280 (including the first and second frontside metals 280-1, 280-2), one or more buried rails 260 (including the first and second buried rails 260-1, 260-2), and one or more trench contacts (including the trench contact 237). There can also be one or more gates (including the gate 235)— that is, there can be one or more input ports.

Backside metals 240, the substrate 210, and the oxide layer 220 are omitted from FIG. 2C so that the layouts of the frontside metals 280, the gate 235, the trench contact 237, and the buried rails 260 are more clearly shown. The dashed rounded square indicates where the gate 235 may be electrically coupled with the one or more buried rails 260 (e.g., with the first buried rail 260-1), and the dashed circle indicates where the trench contact 237 may be electrically coupled with the one or more buried rails 260 (e.g., with the second buried rail 260-2).

As seen in FIGS. 2A and 2B, the integrated circuit structure 200 may further include one or more through-substrate/silicon-vias (TSV) 270 formed within the substrate 210 and the oxide layer 220. The TSVs 270 may be configured to couple the one or more buried rails 260 with the one or more backside metals 240. For example, FIG. 2A illustrates a TSV 270 coupling a buried rail 260 (e.g., the first buried rail 260-1) with the corresponding backside metal 240. FIG. 2B illustrates another TSV 270 coupling a buried rail 260 (e.g., the second buried rail 260-2) with its corresponding backside metal 240.

A particular TSV 270 may be a nano TSV ($\eta$TSV), which is a TSV whose width is narrower than the width of the corresponding buried rail 260. Alternatively, the particular TSV 270 may be a micro TSV ($\mu$TSV), which is a TSV whose width is as wide or wider than the width of the corresponding buried rail 260. In FIGS. 2A and 2B, the TSVs 270 are illustrated as nano TSVs.

As seen in FIGS. 2A and 2B, there can be multiple levels of backside metals 240, and the backside metals 240 of different levels may be coupled with backside vias 250. For example, the backside metals 240 above the backside via 250 may extend in one direction (e.g., X direction), and the backside metals 240 below the backside via 250 may extend in a different direction (e.g., Y direction). The two directions may be orthogonal in an aspect. The backside metals 240 may be formed from metal materials including any one or more of W, Cu, Pd, Ni, Au, Ta, TaN, Ti, TiN, Bi, Sb, Mo, Ru, etc.

In an aspect, the signals may be routed through one or more frontside metals 280 in addition to the buried rails 260. As seen in FIG. 2A, the first frontside metal 280-1 may be coupled to the gate 235 through a gate via 236. As seen in FIG. 2B, the second frontside metal 280-2 may be coupled to the trench contact 237 through a trench contact via 238. That is, in general, the one or more frontside metals 280, the one or more buried rails 260, and the one or more backside metals 240 may be configured or otherwise arranged to route the input signal to the input port of the cell 230. Alternatively or in addition thereto, the one or more frontside metals 280, the one or more buried rails 260, and the one or more backside metals 240 may be configured or otherwise arranged to route the output signal from the output port of the cell 230.

Figure 3:
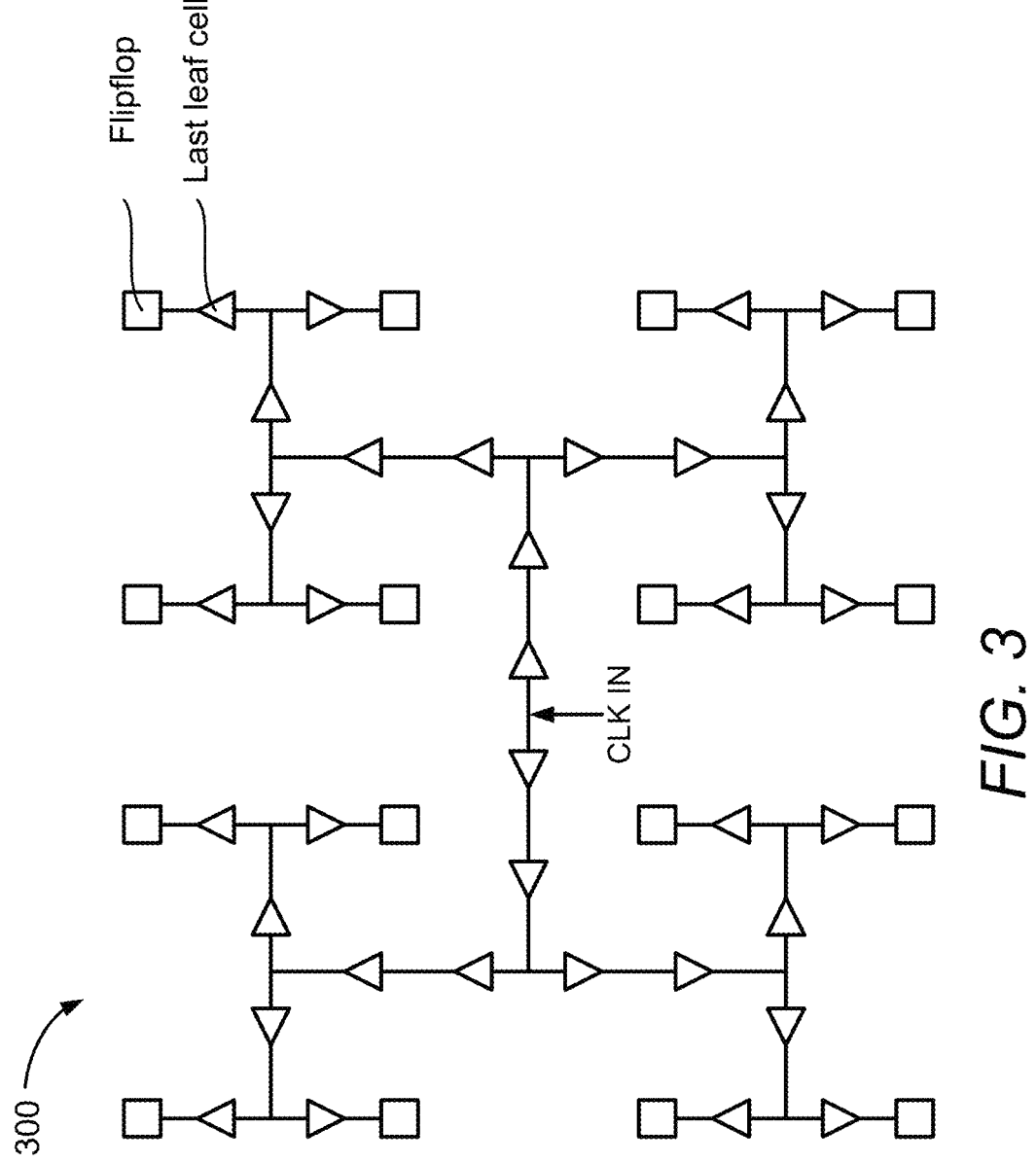
FIG. 3 illustrates an example of a clock distribution network, in accordance with one or more aspects of the disclosure.

An example of a signal distribution network is a clock distribution network 300 illustrated in FIG. 3. The clock distribution network 300 can include a plurality of buffers and some number of flip flops (sixteen in this instance). The clock signal is input at the center and is distributed to the flip flops. Ideally, all flip flops output the clock simultaneously. Unfortunately, in conventional clock distribution networks, routing using frontside metals at different levels (e.g., M0, M1, . . . Mx) can create significant amount of timing uncertainties due to high resistances (e.g., about 400 $\Omega/\mu m$) with 10-11 nm M0 width, which is typical for 2 nm nodes and beyond. As indicated, the resistance changes exponentially at these dimensions with small variations. This increases clock timing uncertainty, especially at the end of the clock network chain—between the last leaf cell and the flip flop. To combat this, the conventional clock distribution network is overdesigned to ensure timing closure. Overdesigning can come with high area and timing penalties, with the latter caused by large capacitances associated with wider lines and/or high-drive clock buffers. For example, even at 28 nm technology, when the clock uncertainty is 0.35 ns, the area penalty can be as high as 36% due to hold-time compensation.

Figure 4:
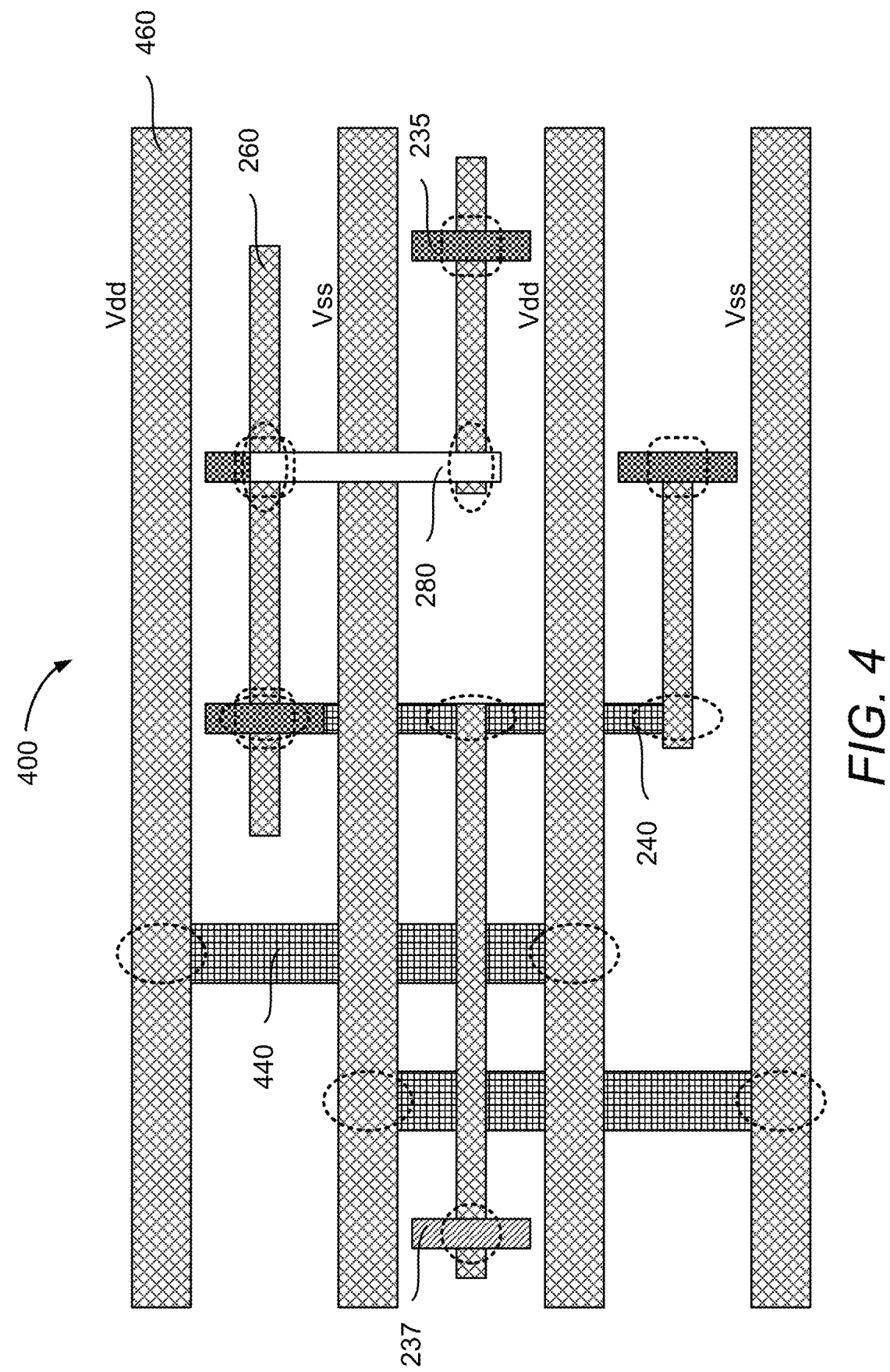
FIG. 4 illustrates an example of an integrated circuit structure configured to route clock signals in accordance with one or more aspects of the disclosure.

However, with routing enabled through backside metals and buried rails, clock timing uncertainties, and therefore accompanying area and timing penalties, can be significantly reduced. An example of an integrated circuit structure 400 for routing clock signals is illustrated in FIG. 4. In this figure, routing near the end leaf cell of a clock distribution network is shown. As seen, there may be multiple gates 235 (which are input ports of cells), multiple buried rails 260, multiple backside metals 240, and one trench contact 237. It should be noted this is merely an example. That is, an integrated circuit structure can include any number of gates 235, buried rails 260, backside metals 240, and trench contacts 237.

Note that there can also be buried rails 460 and backside metals 440 to deliver power (e.g., Vdd, Vss). For differentiation purposes, the buried rails 260 may be referred to as signal distribution buried rails, and the buried rails 460 may be referred to as power distribution buried rails. Also, the backside metals 240 may be referred to as signal distribution back side metals, and the backside metals 440 may be referred to as power distribution back side metals. Thus, in FIG. 4, both power and signal (e.g., clock signal) routing can be handled by the buried rails 460, 260 and backside metals 440, 240.

In an aspect, frontside metals 280 may also be used for signal distribution. By using the signal distribution buried rails 260 and backside metals 240, routing congestion at the frontside is significantly reduced. Indeed, the routing congestion can be completely removed for the clock ports thanks to the straight gate connection from the backside.

In FIG. 4, dashed rounded squares indicate connections (i.e., electrical couplings) between gates 235 and signal distribution buried rails 260, dashed circle indicate connections between trench contacts 237 and signal distribution buried rails 260, horizontal dashed ellipses indicate connections between frontside metals 280 and signal distribution buried rails 260, and small vertical dashed ellipses indicate connections between signal distribution buried rails 260 and signal distribution backside metals 240. In this instance, the connection between the trench contact 237 and one of the signal distribution buried rail 260 may be the output port, where the output of the last leaf cell is provided. Note that in some locations, both dashed rounded square and small dashed vertical ellipse are present. This indicates that gate 235, buried rail 260, and backside metal 240 are connected. Similarly, when a location includes both dashed rounded square and dashed horizontal ellipse, this indicates that frontside metal 280, gate 235, and buried rail 260 are connected.

Regarding power, large vertical dashed ellipses indicate connections between power distribution buried rails 460 and power distribution backside metals 440. Note that the Vdd rails are coupled to each other through one of the power distribution backside metals 440, and Vss rails are coupled to each other through another of the power distribution backside metals 440. The power distribution backside metals 440 and/or the power distribution buried rails 460 may be formed from metal materials including any one or more of W, Cu, Pd, Ni, Au, Ta, TaN, Ti, TiN, Bi, Sb, Mo, Ru, etc.

In an aspect, the power distribution buried rails 460 and the signal distribution buried rails 260 may be parallel. Also, the buried rails 460, 260 may stagger across the routing channels. That is, at least one signal distribution buried rail 260 may be in between adjacent power distribution buried rails 460. Similarly, at least one power distribution buried rail 460 may be in between adjacent signal distribution buried rails 260.

FIGS. 5A-10B illustrate different stages of fabricating an integrated circuit structure, such as the integrated circuit structure 200, 400. So as to reduce clutter, the backside metals 240, backside via 250, frontside metals 280, gate vias 236, and trench contact vias 238 are not illustrated in these figures.

Figure 5A:
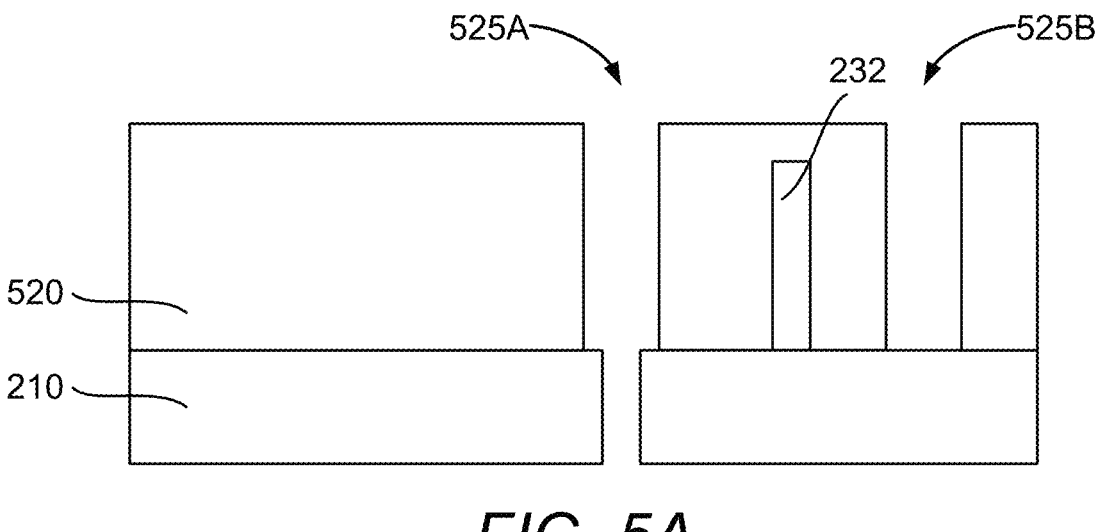
FIGS. 5A-10B illustrate examples of stages of fabricating an integrated circuit structure in accordance with one or more aspects of the disclosure.
Figure 5B:
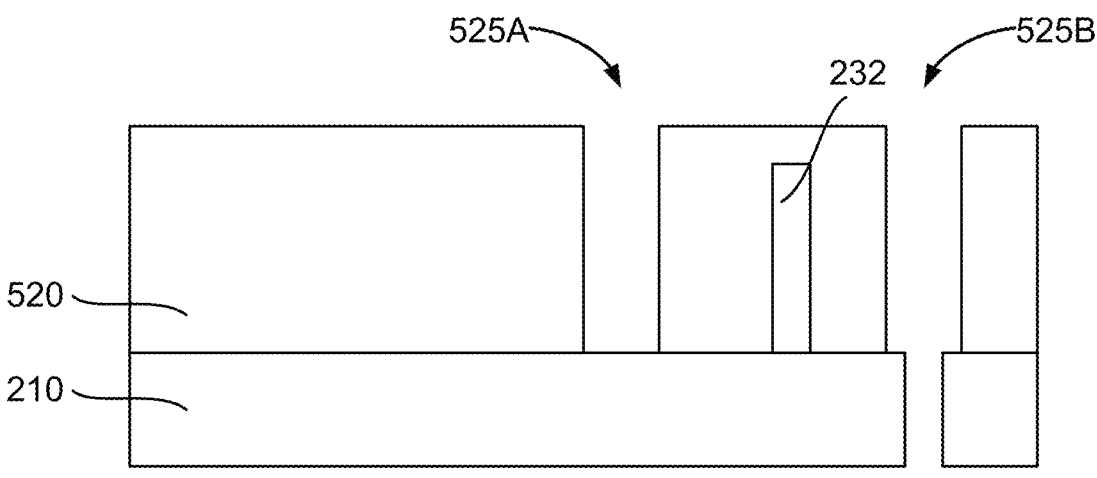

FIGS. 5A and 5B illustrate a stage in which trenches 525A and 525B are formed in the substrate 210 and an initial oxide layer 520. FIG. 5A is a cross sectional view along the line A-A of FIG. 2C, and FIG. 5B is a cross sectional view along the line B-B of FIG. 2C.

Figure 6A:
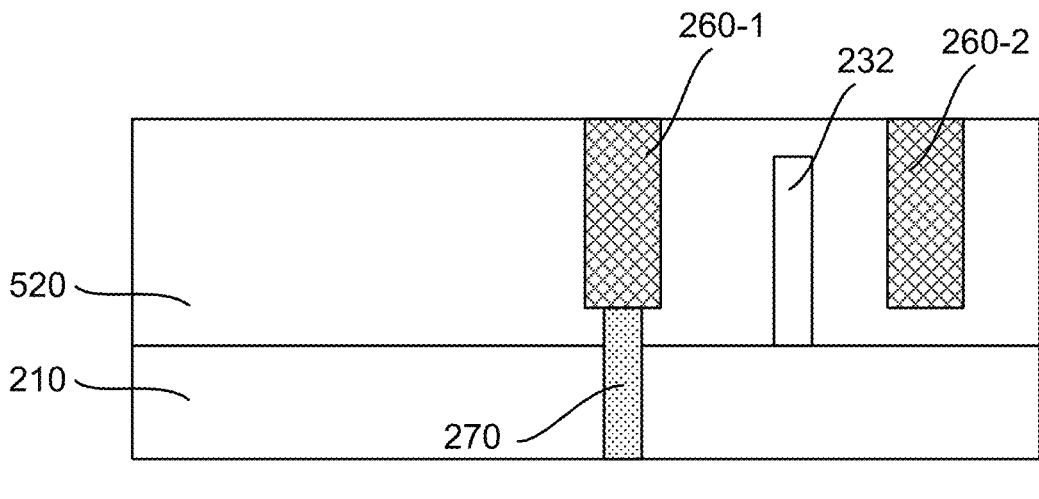
Figure 6B:
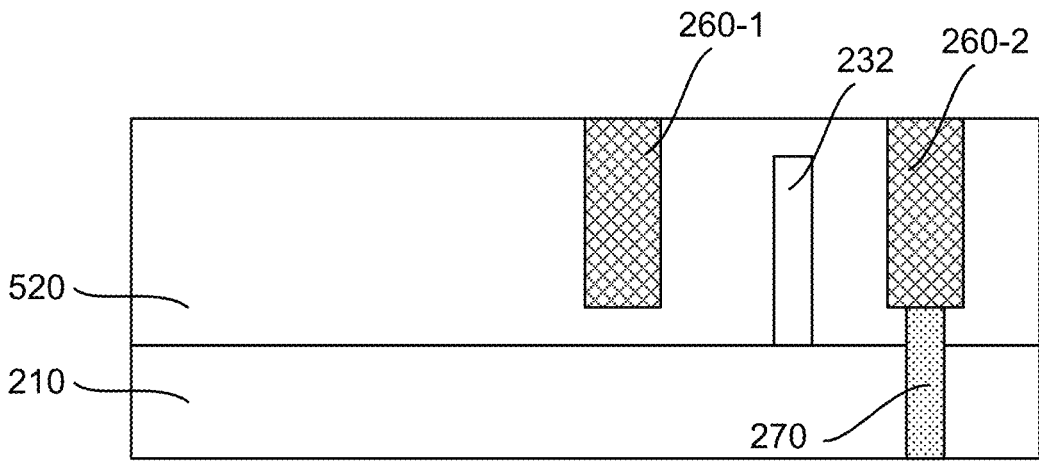

FIGS. 6A and 6B illustrate a stage in which trenches 525A and 525B are filled with metal material to form the buried rails 260 and the TSV 270. FIG. 6A is a cross sectional view along the line A-A of FIG. 2C, and FIG. 6B is a cross sectional view along the line B-B of FIG. 2C.

Figures 7A, 7B:
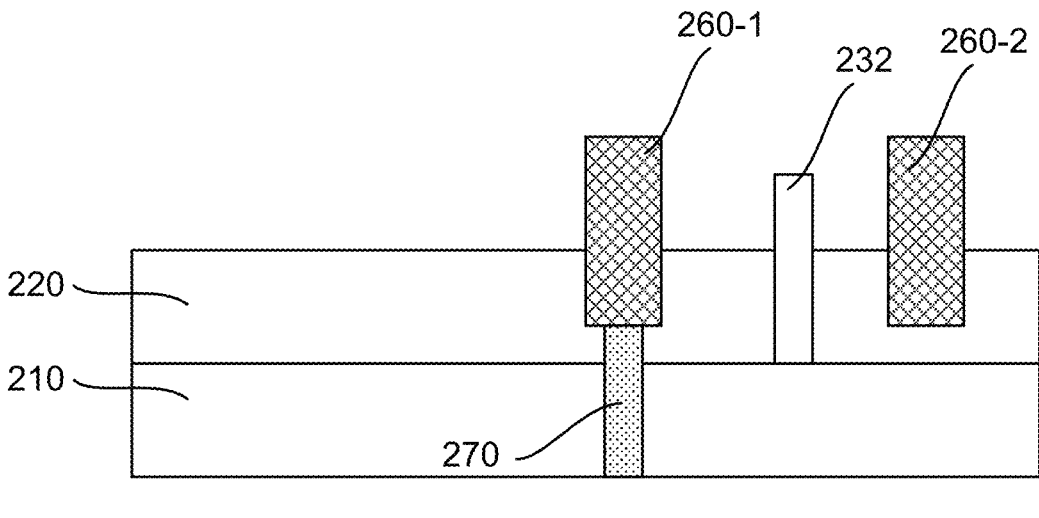

FIGS. 7A and 7B illustrate a stage in which a portion of the initial oxide layer 520 is removed, and the oxide layer 220 remains. In so doing, the portions of the buried rails 260 are exposed. FIG. 7A is a cross sectional view along the line A-A of FIG. 2C, and FIG. 7B is a cross sectional view along the line B-B of FIG. 2C.

Figure 8A:
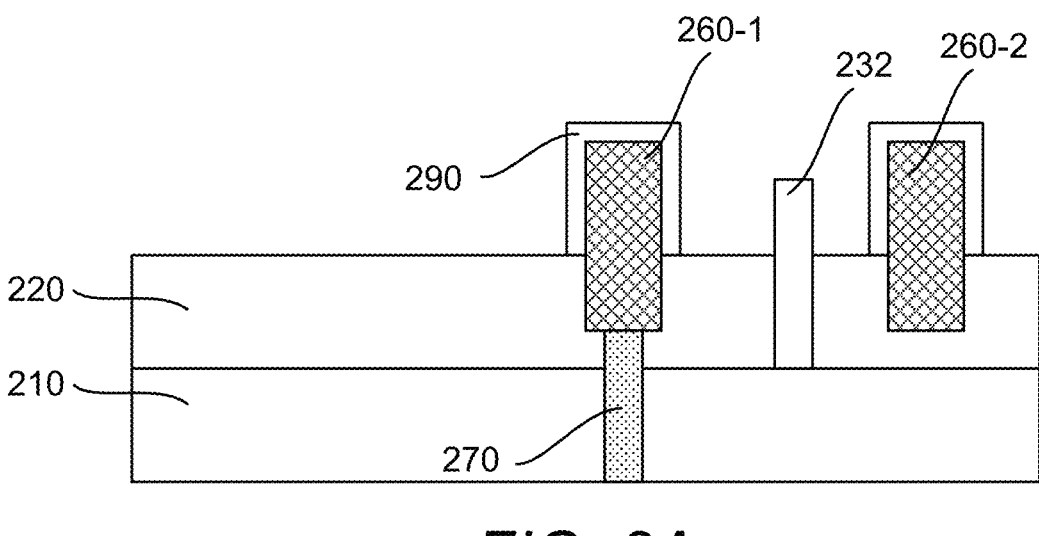
Figure 8B:
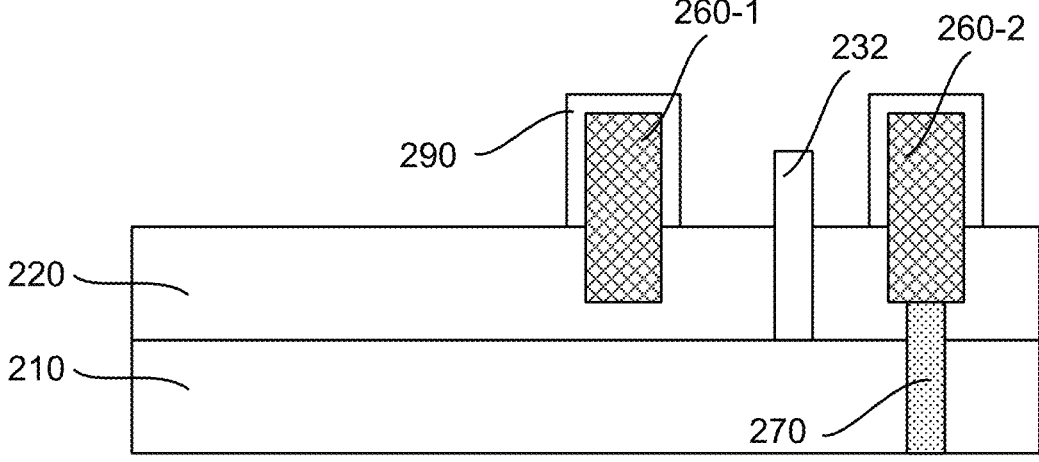

FIGS. 8A and 8B illustrate a stage in which liners 290 are formed on the exposed portions of the buried rails 260. FIG. 8A is a cross sectional view along the line A-A of FIG. 2C, and FIG. 8B is a cross sectional view along the line B-B of FIG. 2C.

Figure 9A:
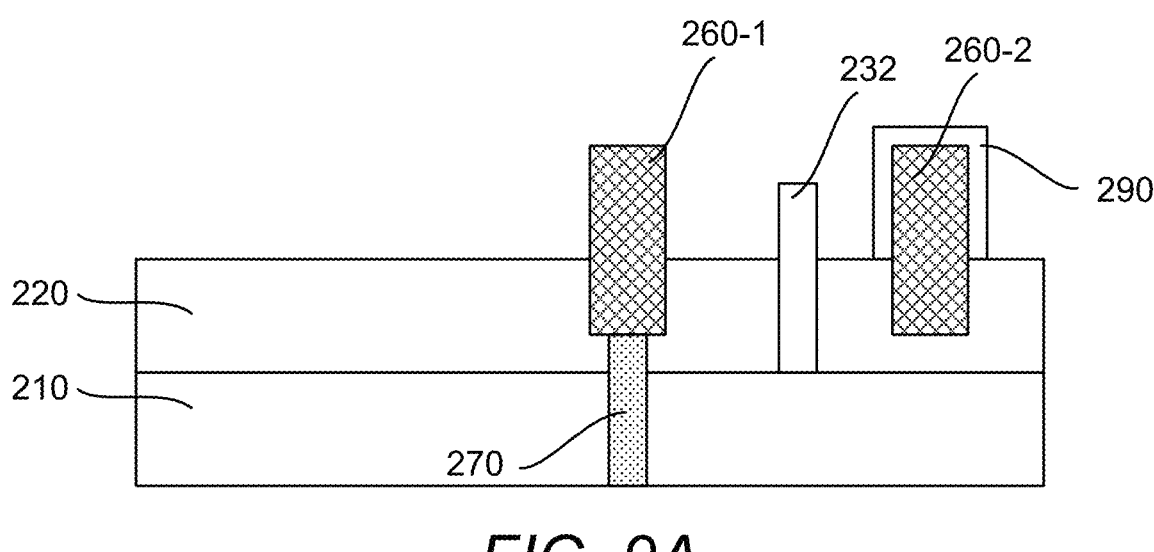
Figure 9B:
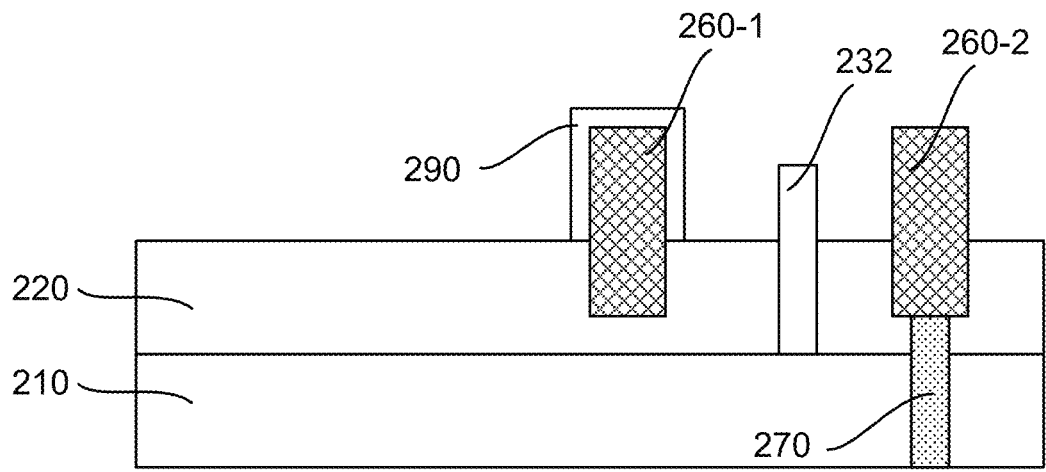

FIGS. 9A and 9B illustrate a stage in which liners 290 are removed from the buried rails at selected locations using masks. For example, the first portion of the first buried rail 260-1 may be removed, e.g., by using a first mask (e.g., a VBG mask). Also, the second portion of the second buried rail 260-2 may be removed, e.g., by using a second mask (e.g., a VBD mask). FIG. 9A is a cross sectional view along the line A-A of FIG. 2C, and FIG. 9B is a cross sectional view along the line B-B of FIG. 2C.

Figure 10A:
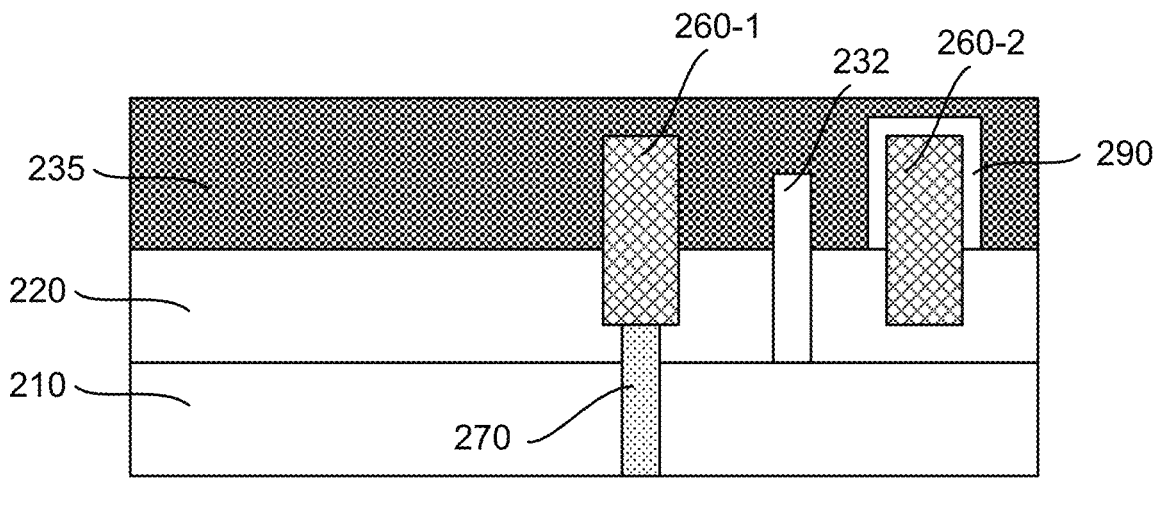
Figure 10B:
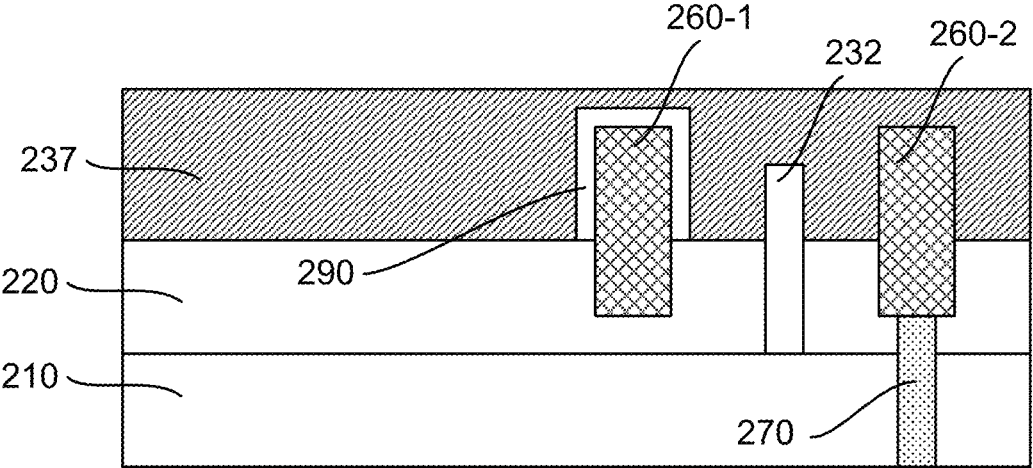

FIGS. 10A and 10B illustrate a stage in which the gate 235 and the trench contact 237 are formed. FIG. 10A is a cross sectional view along the line A-A of FIG. 2C, and FIG. 10B is a cross sectional view along the line B-B of FIG. 2C.

FIG. 11 illustrates a flow chart of an example method 1100 of fabricating an integrated circuit structure such as the integrated circuit structure 200, 400 in accordance with one or more aspects of the disclosure. In block 1110, an oxide layer 220 may be formed on an upper surface of a substrate 210.

In block 1120, one or more cells 230 may be formed on an upper surface of the oxide layer 220. Each cell 230 may comprise one or more transistors configured to provide a logic function, a storage function, or both.

In block 1130, one or more buried rails 260 may be formed partially within the oxide layer 220 and partially above the oxide layer 220.

In block 1140, one or more backside metals 240 may be formed on a lower surface of the substrate 210. The one or more buried rails 260 and the one or more backside metals 240 may be configured such that an input signal to a cell 230 is routed to an input port through the one or more buried rails 260 and the one or more backside metals 240. The input signal may be an input to the logic function and/or the storage function provided by the cell 230. Alternatively or in addition thereto, the one or more buried rails 260 and the one or more backside metals 240 may be configured such that an output signal from the cell 230 is routed from its output port through the one or more buried rails and the one or more backside metals.

FIG. 12 illustrates a flow chart of an example method 1200 of fabricating an integrated circuit structure such as the integrated circuit structure 200, 400 in accordance with one or more aspects of the disclosure. FIG. 12 may be view as being more comprehensive than FIG. 11. Thus, blocks 1210-1240 may be similar to blocks 1110-1140. Therefore, detailed descriptions of blocks 1210-1240 will be omitted for sake of brevity. In block 1250, one or more TSVs 270 may be formed within the substrate 210 and the oxide layer 220. Recall that the one or more TSVs 270 may be configured to couple the one or more buried rails 260 with the one or more backside metals 240. Each of the TSVs 270 may be a nano TSV or a micro TSV.

FIG. 13 illustrates a flow chart of an example process to implement blocks 1230 (forming one or more buried rails 260) and 1250 (forming one or more TSVs 270). In block 1310, one or more trenches 525A, 525B may be formed in an initial oxide layer 520 and the substrate 210. The one or more trenches 525A, 525B may be aligned with the one or more backside metals 240. Block 1310 may correspond to the stage illustrated in FIGS. 5A and 5B.

In block 1320, metal material may be deposited in the one or more trenches 525A, 525B to form the one or more TSVs 270 and the one or more buried rails 260. The metal materials may comprise any one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), ruthenium (Ru), etc. Block 1320 may correspond to the stage illustrated in FIGS. 6A and 6B.

In block 1330, a top portion of the initial oxide layer 520 may be removed to form the oxide layer 220. That is, the oxide layer 220 may be the oxide layer that remains after partially removing the initial oxide layer. The one or more buried rails 260 may be partially within the oxide layer 220 and partially exposed above the oxide layer 220. Block 1320 may correspond to the stage illustrated in FIGS. 7A and 7B.

Referring back to FIG. 12, in block 1260, a gate 235 of a transistor of the cell 230 may be formed. In an aspect, the gate 235 may be in direct contact with a first portion of a first buried rail 260-1, which may be one of the one or more buried rails 260. The gate 235 may be the input port of the cell 230.

In block 1270, one or more trench contacts 237 may be formed on the oxide layer 220. A portion of the trench contact 237 may be in direct contact with a second portion of a second buried rail 260-2, which also may be one of the one or more buried rails 260. The portion of the trench contact 237 in direct contact with the second portion of the second buried rail 260-2 may be the output port of the cell 230.

FIG. 14 illustrates a flow chart of an example process to implement block 1260 (forming the gate 235) and 1270 (forming the trench contact 237). In block 1410, a liner 290 may be formed on portions of the one or more buried rails 260 including the first and second buried rails 260 not covered by the oxide layer 220. Recall that the liner 290 may be insulative. Block 1410 may correspond to the stage illustrated in FIGS. 8A and 8B.

In block 1420, the liner 290 may be selectively removed to expose the first portion of the first buried rail 260-1 and the second portion of the second buried rail 260-2. Block 1420 may correspond to the stage illustrated in FIGS. 9A and 9B.

In block 1430, the gate 235 may be formed to be in direct contact with the exposed first portion of the first buried rail 260-1. Block 1430 may correspond to the stage illustrated in FIG. 10A.

In block 1440, the trench contact 237 may be formed to be in direct contact with the exposed second portion of the second buried rail 260-2. Block 1440 may correspond to the stage illustrated in FIG. 10B.

Referring back to FIG. 12, in block 1280, one or more frontside metals 280 may be formed above the one or more cells 230. The one or more frontside metals 280 may also partake in routing signals. For example, the one or more buried rails 260, the one or more backside metals 240, and the one or more frontside metals 280 may be configured to route the input signal to the input port (e.g., gate 235) of the cell 230. Alternatively or in addition thereto, the one or more buried rails 260, the one or more backside metals 240, and the one or more frontside metals 280 may be configured to route the output signal from the cell 230 from the output port 238 (e.g., trench contact via).

In block 1290, one or more power distribution buried rails 460 may be formed. And in block 1295, one or more power distribution backside metals 440 may be formed. The one or more power distribution buried rails 460 and the one or more power distribution backside metals 440 may be configured to route power (e.g., Vdd, Vss voltages) to the one or more cells 230.

It will be appreciated that the foregoing fabrication processes and related discussion are provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the insulating layers, the metallization structure may have more or less conductive and insulating layers, the cavity orientation, size, whether it is formed of multiple cavities, is closed or open, and other aspects may have variations driven by specific application design features, such as the number of CPU cores, height of standard cell, frequency range, power, etc. Accordingly, the forgoing illustrative examples and associated figures should not be construed to limit the various aspects disclosed and claimed herein.

Figure 15:
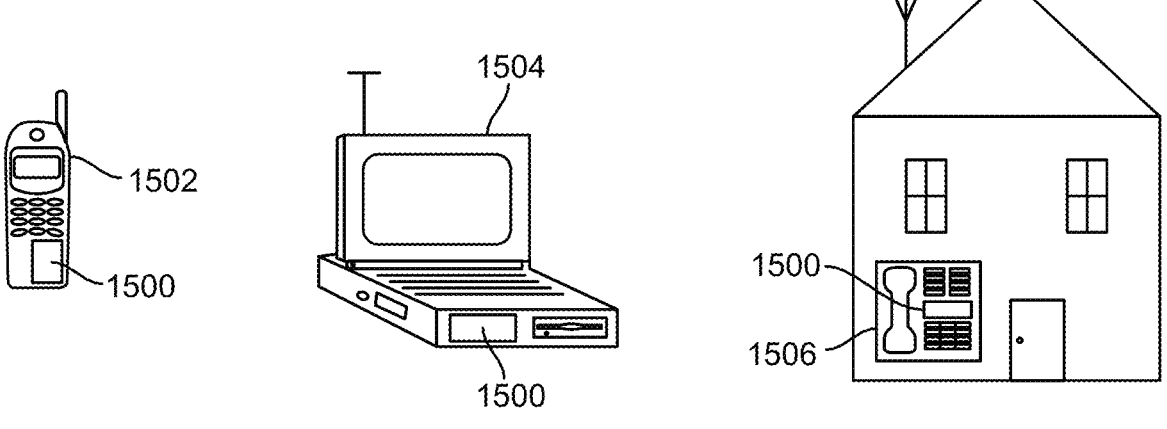
FIG. 15 illustrates various electronic devices which may utilize one or more aspects of the disclosure.

FIG. 15 illustrates various electronic devices 1500 that may be integrated with any of the aforementioned devices in accordance with various aspects of the disclosure. For example, a mobile phone device 1502, a laptop computer device 1504, and a fixed location terminal device 1506 may each be considered generally user equipment (UE) and may include one or more integrated circuit structures (e.g., 200, 400) as described herein.

The devices 1502, 1504, 1506 illustrated in FIG. 15 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: An integrated circuit structure, comprising: an oxide layer on an upper surface of a substrate; one or more cells on an upper surface of the oxide layer, each cell comprising one or more transistors configured to provide a logic function, a storage function, or both; one or more buried rails formed partially within the oxide layer and partially above the oxide layer; and one or more backside metals on a lower surface of the substrate, wherein the one or more buried rails and the one or more backside metals are configured such that an input signal to a cell is routed to an input port of the cell through the one or more buried rails and the one or more backside metals, the cell being one of the one or more cells, the input signal being an input to the logic function and/or the storage function provided by the cell, or an output signal from the cell is routed from an output port of the cell through the one or more buried rails and the one or more backside metals, the output signal being an output of the logic function and/or the storage function provided by the cell, or both.

Clause 2: The integrated circuit structure of clause 1, wherein the cell is a cell of a clock distribution network.

Clause 3: The integrated circuit structure of clause 2, wherein the cell is a buffer or a flip flop.

Clause 4: The integrated circuit structure of any of clauses 1-3, wherein the input port is in direct contact with a first portion of a first buried rail of the one or more buried rails.

Clause 5: The integrated circuit structure of clause 4, wherein the input port is a gate of a transistor of the cell.

Clause 6: The integrated circuit structure of clause 5, wherein the gate is in direct contact with upper and side surfaces of the first buried rail at the first portion.

Clause 7: The integrated circuit structure of any of clauses 5-6, wherein the gate comprises a doped semiconductor.

Clause 8: The integrated circuit structure of any of clauses 1-7, further comprising: a trench contact on the oxide layer, the trench contact being electrically coupled with a second buried rail of the one or more buried rails.

Clause 9: The integrated circuit structure of clause 8, wherein the output port is a portion of the trench contact in direct contact with a second portion of the second buried rail.

Clause 10: The integrated circuit structure of clause 9, wherein the portion of the trench contact is in direct contact with upper and side surfaces of the second buried rail at the second portion.

Clause 11: The integrated circuit structure of any of clauses 8-10, wherein the trench contact comprises a metal.

Clause 12: The integrated circuit structure of clause 11, wherein the trench contact is formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru).

Clause 13: The integrated circuit structure of any of clauses 1-12, further comprising: one or more frontside metals above the one or more cells, wherein the one or more buried rails, the one or more backside metals, and the one or more frontside metals are configured such that the input signal to the cell is routed to the input port through the one or more buried rails, the one or more backside metals, and the one or more frontside metals, or the output signal from the cell is routed from the output port through the one or more buried rails, the one or more backside metals, and the one or more frontside metals, or both.

Clause 14: The integrated circuit structure of any of clauses 1-13, further comprising: one or more through-substrate-vias (TSV) formed within the substrate and the oxide layer, the one or more TSVs configured to couple the one or more buried rails with the one or more backside metals.

Clause 15: The integrated circuit structure of clause 14, wherein at least one TSV is a nano TSV (ηTSV), the ηTSV being a TSV whose width is narrower than a width of a corresponding buried rail, or wherein at least one TSV is a micro TSV (pTSV), the pTSV being a TSV whose width is as wide or wider than a width of a corresponding buried rail, or both.

Clause 16: The integrated circuit structure of any of clauses 1-15, wherein the one or more buried rails are one or more signal distribution buried rails, and wherein the integrated circuit structure further comprises one or more power distribution buried rails configured to route power to the one or more cells.

Clause 17: The integrated circuit structure of clause 16, wherein the one or more signal distribution buried rails are parallel to the one or more power distribution buried rails, and wherein at least one signal distribution buried rail is in between two adjacent power distribution buried rails.

Clause 18: The integrated circuit structure of any of clauses 16-17, wherein the one or more backside metals are one or more signal distribution backside metals, and wherein the integrated circuit structure further comprises one or more power distribution backside metals configured to route the power to the one or more cells in conjunction with the one or more power distribution buried rails.

Clause 19: The integrated circuit structure of any of clauses 1-18, wherein the one or more buried rails are formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru), and wherein the one or more backside metals are formed from one or more of W, Cu, Pd, Ni, Au, Ta, TaN, Ti, TiN, Bi, Sb, Mo, and Ru.

Clause 20: The integrated circuit structure of any of clauses 1-19, wherein the integrated circuit structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 21: A method of fabricating an integrated circuit structure, the method comprising: forming an oxide layer on an upper surface of a substrate; forming one or more cells on an upper surface of the oxide layer, each cell comprising one or more transistors configured to provide a logic function, a storage function, or both; forming one or more buried rails partially within the oxide layer and partially above the oxide layer; and forming one or more backside metals on a lower surface of the substrate, wherein the one or more buried rails and the one or more backside metals are configured such that an input signal to a cell is routed to an input port of the cell through the one or more buried rails and the one or more backside metals, the cell being one of the one or more cells, the input signal being an input to the logic function and/or the storage function provided by the cell, or an output signal from the cell is routed from an output port of the cell through the one or more buried rails and the one or more backside metals, the output signal being an output of the logic function and/or the storage function provided by the cell, or both.

Clause 22: The method of clause 21, further comprising: forming one or more through-substrate-vias (TSV) within the substrate and the oxide layer, the one or more TSVs configured to couple the one or more buried rails with the one or more backside metals.

Clause 23: The method of clause 22, wherein at least one TSV is a nano TSV (ηTSV), the ηTSV being a TSV whose width is narrower than a width of a corresponding buried rail, or wherein at least one TSV is a micro TSV (μTSV), the μTSV being a TSV whose width is as wide or wider than a width of a corresponding buried rail, or both.

Clause 24: The method of any of clauses 22-23, wherein forming the one or more buried rails and forming the one or more TSVs comprise: forming one or more trenches in an initial oxide layer and the substrate, the one or more trenches being aligned with the one or more backside metals; depositing metal material in the one or more trenches to form the one or more TSVs and the one or more buried rails; and removing a top portion of the initial oxide layer to form the oxide layer such that the one or more buried rails are partially within the oxide layer and partially exposed above the oxide layer.

Clause 25: The method of clause 24, further comprising: forming a gate of a transistor of the cell in direct contact with a first portion of a first buried rail of the one or more buried rails, the gate being the input port; and forming a trench contact on the oxide layer, a portion of the trench contact in direct contact with a second portion of a second buried rail of the one or more buried rails, the portion of the trench contact in direct contact with the second portion of the second buried rail being the output port.

Clause 26: The method of clause 25, wherein forming the gate and forming the trench contact comprise: forming a liner on portions of the one or more buried rails including the first and second buried rails not covered by the remaining oxide layer, the liner being insulative; removing the liner to expose the first portion of the first buried rail and the second portion of the second buried rail; forming the gate to be in direct contact with the exposed first portion of the first buried rail; and forming the trench contact to be in direct contact with the exposed second portion of the second buried rail.

Clause 27: The method of any of clauses 25-26, wherein the gate is in direct contact with upper and side surfaces of the first buried rail at the first portion, or wherein the trench contact is in direct contact with upper and side surfaces of the second buried rail at the second portion, or both.

Clause 28: The method of any of clauses 21-27, wherein the cell is a cell of a clock distribution network.

Clause 29: The method of any of clauses 21-28, further comprising: forming one or more frontside metals above the one or more cells, wherein the one or more buried rails, the one or more backside metals, and the one or more frontside metals are configured such that the input signal to the cell is routed to the input port through the one or more buried rails, the one or more backside metals, and the one or more frontside metals, or the output signal from the cell is routed from the output port through the one or more buried rails, the one or more backside metals, and the one or more frontside metals, or both.

Clause 30: The method of any of clauses 21-29, wherein the one or more buried rails are one or more signal distribution buried rails and the one or more backside metals are one or more signal distribution backside metals, and wherein the method further comprises: forming one or more power distribution buried rails; and forming one or more power distribution backside metals, the one or more power distribution buried rails and the one or more power distribution backside metals being configured to route power to the one or more cells.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit structure, comprising:
an oxide layer on an upper surface of a substrate;
one or more cells on an upper surface of the oxide layer, each cell comprising one or more transistors configured to provide a logic function, a storage function, or both;
one or more buried rails formed partially within the oxide layer and partially above the oxide layer; and
one or more backside metals on a lower surface of the substrate
wherein the one or more buried rails and the one or more backside metals are configured such that
an input signal to a cell is routed to an input port of the cell through the one or more buried rails and the one or more backside metals, the cell being one of the one or more cells, the input signal being an input to the logic function and/or the storage function provided by the cell, or
an output signal from the cell is routed from an output port of the cell through the one or more buried rails and the one or more backside metals, the output signal being an output of the logic function and/or the storage function provided by the cell, or
both.

2. The integrated circuit structure of claim 1, wherein the cell is a cell of a clock distribution network.

3. The integrated circuit structure of claim 2, wherein the cell is a buffer or a flip flop.

4. The integrated circuit structure of claim 1, wherein the input port is in direct contact with a first portion of a first buried rail of the one or more buried rails.

5. The integrated circuit structure of claim 4, wherein the input port is a gate of a transistor of the cell.

6. The integrated circuit structure of claim 5, wherein the gate is in direct contact with upper and side surfaces of the first buried rail at the first portion.

7. The integrated circuit structure of claim 5, wherein the gate comprises a doped semiconductor.

8. The integrated circuit structure of claim 1, further comprising:
a trench contact on the oxide layer, the trench contact being electrically coupled with a second buried rail of the one or more buried rails.

9. The integrated circuit structure of claim 8, wherein the output port is a portion of the trench contact in direct contact with a second portion of the second buried rail.

10. The integrated circuit structure of claim 9, wherein the portion of the trench contact is in direct contact with upper and side surfaces of the second buried rail at the second portion.

11. The integrated circuit structure of claim 8, wherein the trench contact comprises a metal.

12. The integrated circuit structure of claim 11, wherein the trench contact is formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru).

13. The integrated circuit structure of claim 1, further comprising:
one or more frontside metals above the one or more cells, wherein the one or more buried rails, the one or more backside metals, and the one or more frontside metals are configured such that
the input signal to the cell is routed to the input port through the one or more buried rails, the one or more backside metals, and the one or more frontside metals, or
the output signal from the cell is routed from the output port through the one or more buried rails, the one or more backside metals, and the one or more frontside metals, or
both.

14. The integrated circuit structure of claim 1, further comprising:
one or more through-substrate-vias (TSV) formed within the substrate and the oxide layer, the one or more TSVs configured to couple the one or more buried rails with the one or more backside metals.

15. The integrated circuit structure of claim 14, wherein at least one TSV is a nano TSV ($\eta$TSV), the $\eta$TSV being a TSV whose width is narrower than a width of a corresponding buried rail, or
wherein at least one TSV is a micro TSV ($\mu$TSV), the $\mu$TSV being a TSV whose width is as wide or wider than a width of a corresponding buried rail, or
both.

16. The integrated circuit structure of claim 1, wherein the one or more buried rails are one or more signal distribution buried rails, and
wherein the integrated circuit structure further comprises one or more power distribution buried rails configured to route power to the one or more cells.

17. The integrated circuit structure of claim 16, wherein the one or more signal distribution buried rails are parallel to the one or more power distribution buried rails, and
wherein at least one signal distribution buried rail is in between two adjacent power distribution buried rails.

18. The integrated circuit structure of claim 16, wherein the one or more backside metals are one or more signal distribution backside metals, and
wherein the integrated circuit structure further comprises one or more power distribution backside metals configured to route the power to the one or more cells in conjunction with the one or more power distribution buried rails.

19. The integrated circuit structure of claim 1, wherein the one or more buried rails are formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru), and
wherein the one or more backside metals are formed from one or more of W, Cu, Pd, Ni, Au, Ta, TaN, Ti, TiN, Bi, Sb, Mo, and Ru.

20. The integrated circuit structure of claim 1, wherein the integrated circuit structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

21. The integrated circuit structure of claim 1, wherein at least one backside metal of the one or more backside metals is in direct contact with the lower surface of the substrate.

* * * * *